United States Patent
Hoskote et al.

(10) Patent No.: US 7,149,675 B2
(45) Date of Patent: Dec. 12, 2006

(54) SYSTEM AND METHOD FOR AUTOMATICALLY MAPPING STATE ELEMENTS FOR EQUIVALENCE VERIFICATION

(75) Inventors: Yatin V. Hoskote, Portland, OR (US); Kiran B. Doreswamy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 819 days.

(21) Appl. No.: 09/802,616

(22) Filed: Mar. 9, 2001

(65) Prior Publication Data

US 2002/0144215 A1    Oct. 3, 2002

(51) Int. Cl.
*G06F 17/50* (2006.01)

(52) U.S. Cl. .................. 703/15; 703/12; 703/14; 703/16; 703/17; 716/3; 716/4; 716/5

(58) Field of Classification Search .............. 703/15, 703/13, 14; 716/3–5
See application file for complete search history.

(56) References Cited

U.S. PATENT DOCUMENTS

| | | | |
|---|---|---|---|
| 5,638,381 A | | 6/1997 | Cho et al. |
| 5,754,454 A | * | 5/1998 | Pixley et al. .............. 702/123 |
| 6,035,107 A | * | 3/2000 | Kuehlmann et al. .......... 716/1 |
| 6,035,109 A | * | 3/2000 | Ashar et al. ................ 716/3 |
| 6,141,633 A | | 10/2000 | Iwashita et al. |
| 6,163,876 A | * | 12/2000 | Ashar et al. ................ 716/5 |
| 6,247,163 B1 | * | 6/2001 | Burch et al. ............... 716/3 |
| 6,301,687 B1 | * | 10/2001 | Jain et al. ................. 716/3 |
| 6,496,955 B1 | * | 12/2002 | Chandra et al. ............ 716/3 |
| 6,651,225 B1 | * | 11/2003 | Lin et al. .................. 716/4 |
| 6,687,882 B1 | * | 2/2004 | McElvain et al. ........... 716/3 |

OTHER PUBLICATIONS

"An Efficient Equivalence Checker for Combinational Circuits", Matsunaga, DAC 96', ACM 1996.*
Hulgaard et al., *Equivalence Checking of Combinational Circuits Using Boolean Expression Diagrams*, Danish Technical Research Council.
Cornelis A.J. van Eijk, *Formal Methods for the Verification of Digital Circuits*, dissertation dated Sep. 9, 1997, Eindhoven University of Technology, Netherlands, pp. 1-144.

* cited by examiner

*Primary Examiner*—Fred Ferris
(74) *Attorney, Agent, or Firm*—Kenyon & Kenyon LLP

(57) ABSTRACT

A method for automatically mapping state elements between a first circuit and a second circuit is described. The method proceeds by comparing, in a structural phase, structural features of state elements in the first circuit to structural features of state elements in the second circuit for equivalence. Mappings between state elements of the first circuit and the second circuit are determined based on the comparison of structural features. "Don't care" input conditions are then accounted for prior to determination of functional features. During an inversion detection phase, the polarity of the mappings found in the prior structural phase are determined. A functional phase follows in which the functionality of state elements in the first circuit are compared to the functionality of state elements in the second circuit for equivalence using a three-valued random simulation and further mappings are determined based upon the functional comparison.

21 Claims, 8 Drawing Sheets

FIG. 4

| Fanin signatures | | Fanout signatures | |
|---|---|---|---|
| ABE | DJ | C | BF |
| *S9* | S11 | S9 | S11 |
| *I45* | I59 | I45 | I59 |
| | S7 | S57 | S29 |
| | I35 | I14 | I8 |
| | | S80 | S64 |
| | | I26 | I53 |
| | | I75 | |
| | | I76 | |

| Fanin signatures | | Fanout signatures | |
|---|---|---|---|
| ABE | DJR | C | BF |
| *S9* | *S11* | S9 | S11 |
| *I45* | *I59* | I45 | I59 |
| | | S57 | S29 |
| | | I14 | I8 |
| | | S80 | S64 |
| | | I26 | I53 |
| | | I75 | |
| | | I76 | |

| 250 | In[1] | In[2] | In[3] | Out[1] | Out[2] | Out[3] |
|---|---|---|---|---|---|---|
| | 0 | 0 | 0 | 0 | 1 | 0 |
| | 0 | 0 | 1 | 1 | 1 | 1 |
| | 0 | 1 | 0 | 0 | 1 | 1 |
| Don't care input | 0 | 1 | 1 | 1 | 0 | 1 |
| | 1 | 0 | 0 | 0 | 0 | 0 |
| Don't care input | 1 | 0 | 1 | 1 | 0 | 1 |
| | 1 | 1 | 0 | 1 | 1 | 0 |
| | 1 | 1 | 1 | 0 | 1 | 0 |

| 255 | In[4] | In[5] | In[6] | Out[4] | Out[5] | Out[6] |
|---|---|---|---|---|---|---|
| | 0 | 0 | 0 | 0 | 1 | 0 |
| | 0 | 0 | 1 | 1 | 1 | 1 |
| | 0 | 1 | 0 | 0 | 1 | 1 |
| Don't care input | 0 | 1 | 1 | 0 | 1 | 1 |
| | 1 | 0 | 0 | 0 | 0 | 0 |
| Don't care input | 1 | 0 | 1 | 0 | 0 | 1 |
| | 1 | 1 | 0 | 1 | 1 | 0 |
| | 1 | 1 | 1 | 0 | 1 | 0 |

270

| | D | L | D' | L' | M[1] | M[1]' | UM[1] | UM[1]' | Z | Z' |
|---|---|---|---|---|---|---|---|---|---|---|
| 1 | 0 | 1 | 0 | 0 | X | X | X | X | 0 | 1 |
| 2 | 1 | 1 | 1 | 0 | X | X | X | X | 1 | 0 |
| 3 | 0 | 0 | 0 | 1 | X | X | X | X | 0 | 1 |
| . | | | | | | | | | | |
| . | | | | | | | | | | |
| . | | | | | | | | | | |
| 30 | 1 | 0 | 1 | 1 | X | X | X | X | 0 | 1 |
| 31 | 0 | 1 | 0 | 0 | X | X | X | X | 0 | 1 |
| 32 | 1 | 0 | 1 | 1 | X | X | X | X | X | X |

SYSTEM AND METHOD FOR AUTOMATICALLY MAPPING STATE ELEMENTS FOR EQUIVALENCE VERIFICATION

FIELD OF THE INVENTION

The present invention relates to formal equivalence verification for very large scale integrated (VLSI) circuits, and in particular relates to an algorithm for automatically mapping the state elements of two circuits that is executed to enable subsequent combinational formal equivalence verification of the circuits.

BACKGROUND INFORMATION

With the increasing complexity and shorter development cycles of current digital systems, it has become more difficult to verify that circuits designed for these systems have the correct structure and functionality. To assist in reducing errors and streamlining the development process, formal equivalence verification techniques are used to verify that circuit descriptions preceding and following a design step define the same functionality. Currently, the predominant formal equivalence verification technique is combinational verification, in which input and output logic cones of state elements (elements which store values) are compared between a model specification circuit, and a new implementation circuit. This technique generally involves building binary decisions diagrams (BDDs) to plot the various states that a state element may enter as a function of the inputs it is provided. If a BDD constructed for a state element X in the specification circuit is equivalent to a BDD constructed for element X' of the implementation circuit, then it is concluded that the circuits have identical functionality with respect to the particular state element. To complete the verification process, BDDs are constructed and compared for each state element of the specification circuit.

The combinational formal verification process requires that analogous state elements are compared between the specification and implementation circuits. However, the process of building BDDs is very difficult because state element mappings are often unknown. In practice, there is no automatic correspondence between state elements of the two circuits because, for example, not all the state elements retain their unique identifiers or "names" from step to step in the design process. In fact, often more than fifty percent of the state elements in a circuit are not name-mapped. Therefore, prior to formal verification, a state element mapping must be constructed which maps, or draws an inter-circuit correspondence between, state elements of the specification and implementation circuits.

The theoretical purpose of state mapping is to produce a one-to-one correspondence between state elements of the specification and implementation circuits. In practice, however, one-to-many and inverse mappings often occur in addtion to one-to-one mappings. One-to-many mappings exist when the implementation circuit contains duplicate versions of a single state element found in the specification circuit. In inverse mappings (as opposed to direct mappings), state elements in the two circuits are structurally equivalent but exactly opposite in function, so that, for example, a set of equivalent logic conditions that produce a value bit-stream of '110' in a given state element A will produce a value bit-stream of '001' in inverted mapped element A'. While it is especially crucial to identify such inverted mapped state elements which have equivalent but opposite output, it is also important to identify "don't care" input conditions for which mapped state elements are permitted to have different outputs. Without prior identification of such don't care conditions, such mappings can be invalidated during functional simulations. Both inverse mappings and don't cares must accordingly be accounted for during the state element mapping process.

As of the present time, attempts at automatic state mapping have been largely unsuccessful, in part because they have not appropriately accounted for the variety of state element contingencies described. Moreover, manual state mapping currently requires as much as several days per functional circuit block. What is needed, therefore, is an optimized automatic state mapping process that properly utilizes available information concerning state element input conditions, appropriately accounts for inverse mappings and provides a dramatic improvement in efficiency over manual state mapping techniques.

BRIEF DESCRIPTION OF THE DRAWINGS

FIG. 4 show exemplary groups of state elements having fanin and fanout signatures which match fanin and fanout signatures of the state elements as illustrated in FIG. 3 and FIG. 3a.

DETAILED DESCRIPTION

Figure 1:
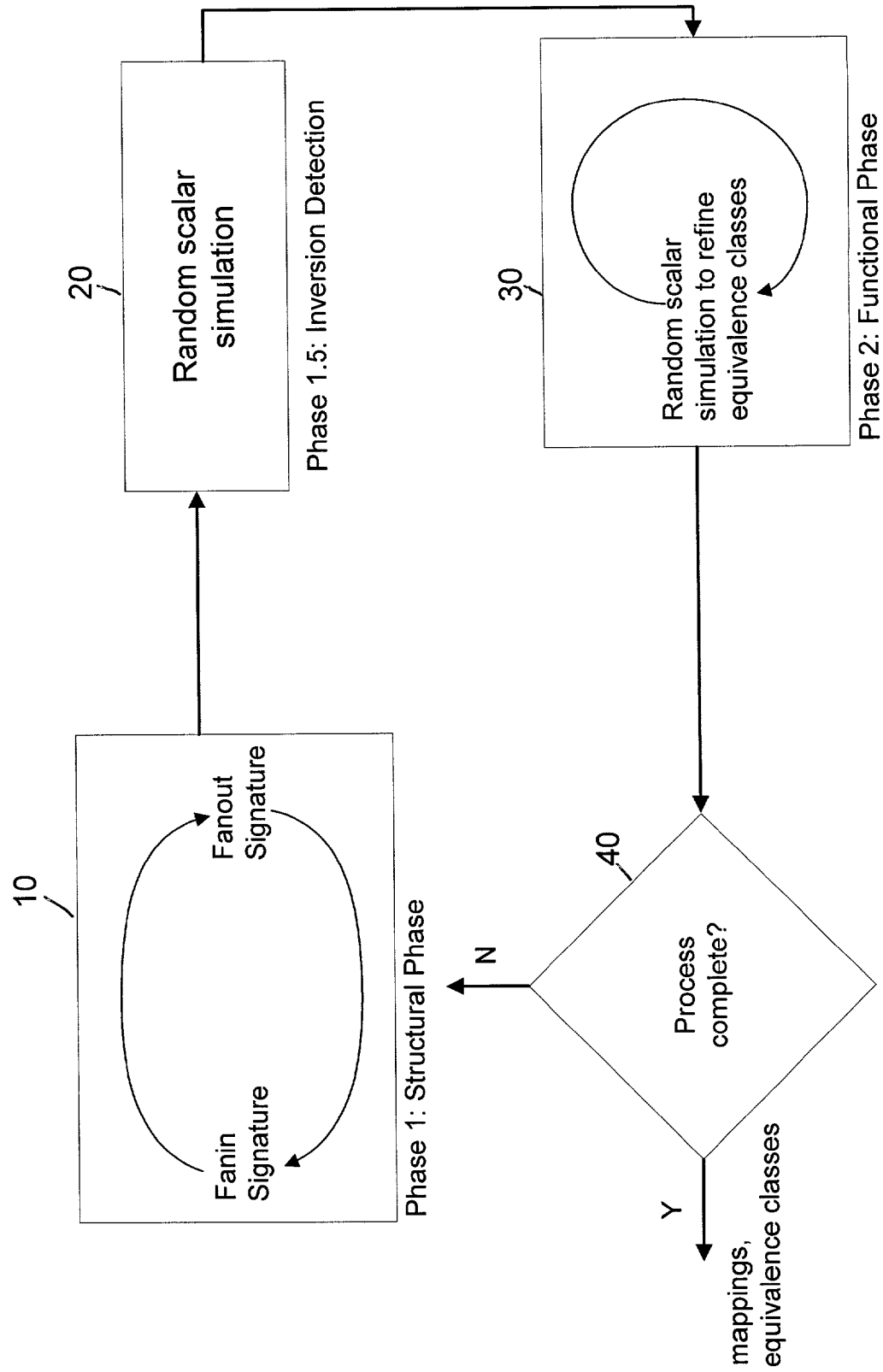
FIG. 1 shows a high-level flow diagram illustrating an embodiment of the automatic state element mapping method of the present invention.

FIG. 1 illustrates a high-level flow diagram of an embodiment of the automatic state element mapping process according to the present invention. The state element mapping method is divided into three phases: a structural phase (Phase 1) 10, an inversion detection phase (Phase 1.5) 20 and a functional phase (Phase 2) 30. As indicated by the arrows connecting the phases in FIG. 1, the phases are performed in sequential order and may be repeated depending upon whether a threshold criterion is satisfied, indicating that the mapping process is complete.

During the structural phase, Phase 1, partial fanin signatures of state elements of a first specification circuit are compared to partial fanin signatures of state elements of a second implementation circuit. A fanin signature of a particular element includes an alphabetically sorted list of the primary inputs and other state elements which provide inputs to that state element. Comparison of fanout signatures between state elements is also performed, the fanout signatures including an alphabetically sorted list of primary outputs and other state elements to which a particular state element provides an output. In general, at the outset of the structural phase, fanin and fanout signatures will be incomplete because many of the input and output state elements have not yet been mapped and identified. Only mapped state elements are incorporated into the signatures, and therefore, the fanin and fanout signatures are largely 'partial' signatures. When only two state elements—one from each circuit—have a particular partial fanin or fanout signature, then the two elements are mapped to each other and given an identification. The structural phase increases the number of mapped elements in an iterative process in which fanin and fanout signatures are updated and made more complete when new mappings are identified, the updated signatures in turn leading to more mappings being identified. The process ends when no new mappings are identified or after a certain number of iterations during which no mappings are identified, referred to as the fix point. The structural phase is described in greater detail below with reference to FIG. 2, FIG. 3a, FIG. 3b and FIG. 4. It is noted that the structural phase is performed rapidly due to the speed of the relevant calculations.

Generally, after the fix point has been reached, not all state elements have been mapped. Moreover, the mappings identified in the structural phase do not indicate whether the mappings are direct mapped, or inverse mapped, as they only indicate structural and not functional correspondence. Furthermore, due to the imperfect nature of attributing equivalence based solely on input and output structure, a small number of the mappings determined during the structural phase will be incorrect. Therefore, an inversion detection phase (Phase 1.5) is employed to determine the polarity (direct vs. inverse mapped status) of the mappings and to validate the mappings identified in the structural phase.

However, prior to the commencement of the inversion detection phase, don't care conditions are identified, so that differences in output between two mapped state elements in response to these identified conditions does not cause their invalidation during the subsequent inversion detection and functional phases. After don't care conditions have been accounted for, the state elements mapped during the structural phase are fed random input vectors on their respective inputs in a simulation. If the mapped state elements output the same values in response to equivalent input values, then they are direct mapped, and if they output opposite values they are inverse mapped. The inversion detection phase is also iterative, providing feedback via updates to the random simulation input vectors whenever a determination has been made. The inversion phase is described in greater detail below with reference to FIG. 6. The inversion phase is also performed rapidly.

A functional phase, Phase 2, follows the inversion phase, and during this phase the state elements are tested with further random simulations in order to group state elements according to the functionality of their associated fanin and fanout logic. Each group, referred to as an equivalence class, is refined during further random simulations, and at each stage the number of state elements within each class is reduced and the number of classes increases. When an equivalence class contains only two state elements (one from each circuit) the two elements are mapped to one another and so identified. The functional phase is also described in greater detail below with reference to FIG. 7. The functional phase is the most computationally intensive of the three phases.

Figure 2:
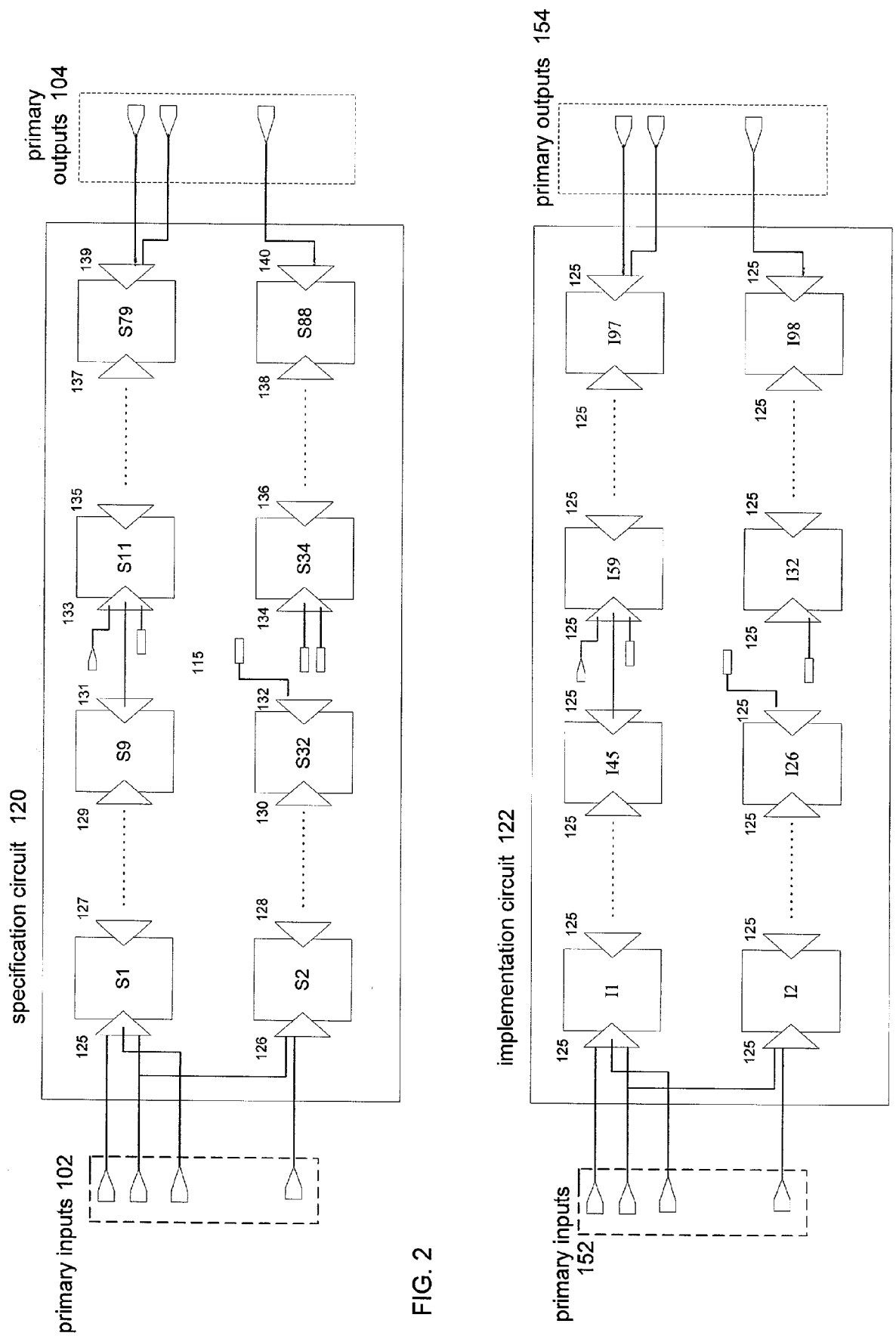
FIG. 2 illustrates a schematic block diagram of a first specification circuit and a second implementation circuit.

FIG. 2 schematically illustrates a specification circuit 120 and an implementation circuit 122. The specification circuit 120 receives input from a set of primary inputs 102. The primary inputs are supplied in various combinations to the fanin logic cones 125, 126, 129, 130, 133, 134, 137 and 138 of respective state elements S1, S2, S9, S32, S11, S34, S79 and S88 of the specification circuit 120. Although only eight state elements are shown, and the elements are numbered only up to S88, these amounts and numbers are for illustrative purposes and in no way reflect the design and size of an actual specification circuit, which can contain, for example, tens of thousands of state elements. The state elements S1, S2 . . . S88 store values which depend upon the values of the inputs they are provided and also depend upon the logical operations of their fanin logic cones which contain various combinational logic gates. The state elements S1, S2 . . . S88 output the values they store through fanout logic cones 127, 128, 131, 132, 135, 136, 139 and 140. Connection lines, such as lines 115, 116 emerge from logic cones and supply inputs to other state elements. For example, the state element S9 sends output to state element S11 over connection line 115 and state element S34 receives input from another state element (not shown) through connection line 116. State elements also supply primary outputs 104 external to the specification circuit 120. As shown, state elements S79 and S88 supply several primary outputs 104.

FIG. 2 also illustrates a second circuit, referred to as an implementation circuit 122 that is related to the specification circuit 120. As the implementation circuit 122 is compared to the specification circuit 120 for equivalence, they generally have the same primary inputs and primary outputs. Thus, the set of primary inputs 152 supplied to the implementation circuit 122 corresponds to the set of primary inputs 104 to the specification circuit 120, and, similarly, the set of primary outputs 154 of the implementation circuit 122 correspond to the set of primary outputs 104 of the specification circuit 120. The implementation circuit 122 includes state elements I1, I2, I45, I26, I59, I32, I97 and I98. Many of the individual state elements I1, I2 . . . I98 implementation circuit correspond on a one-to-one basis with individual state elements S1, S2 . . . S88 in the specification circuit 120 (although not necessarily in the same order). As indicated above, the one-to-one correspondence may not be exact due to one-to-many and inverse mappings, so that the number and arrangement of state elements within the implementation circuit 122 may differ from that of the specification circuit 120.

Figure 3A:
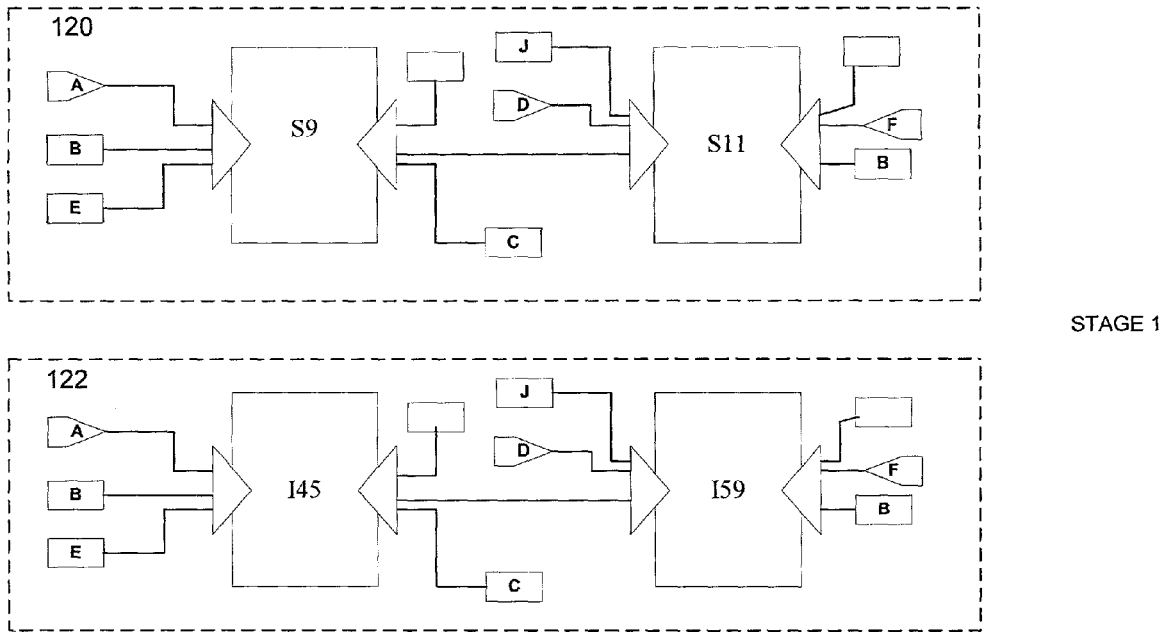
FIG. 3a shows two exemplary state elements in the first specification circuit and two exemplary state elements in the second implementation circuit, illustrating the structural phase according to an embodiment of the present invention.
Figure 3B:
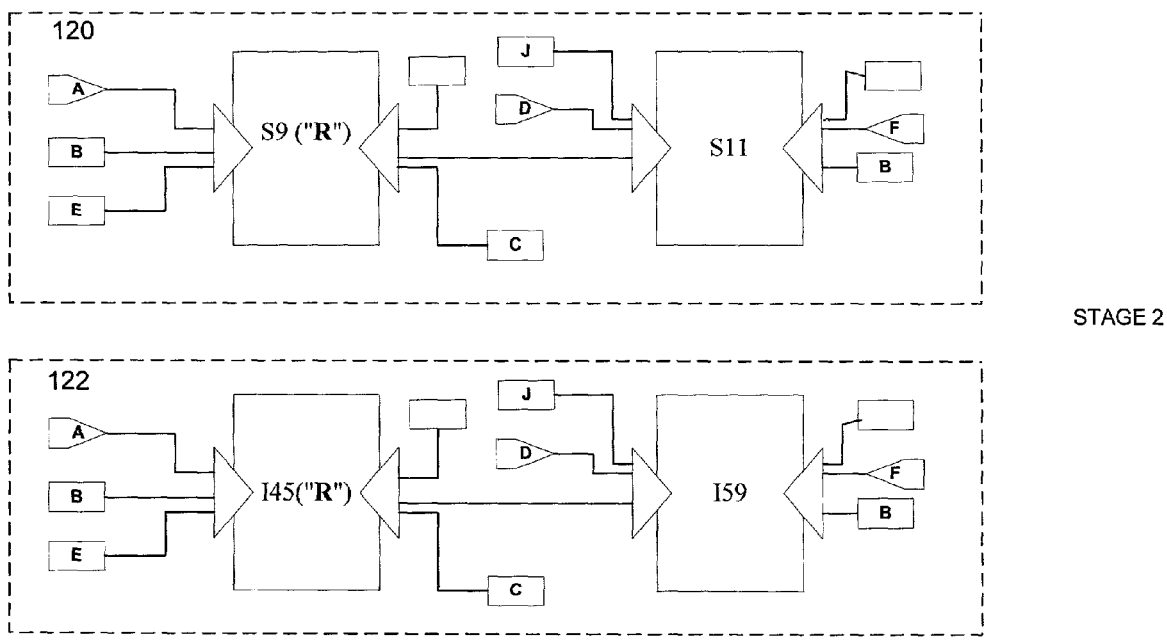
FIG. 3b illustrates the same exemplary state elements shown in FIG. 3a after one of the state elements from the implementation circuit has been mapped to one of the state elements of the specification circuit according to an embodiment of the present invention.

FIG. 3a, FIG. 3b and FIG. 4 illustrate an exemplary embodiment of the structural phase. FIG. 3a, labeled Stage 1, illustrates an exploded view of elements S9 and S11 of the specification circuit 120 and elements I45 and I59 of the implementation circuit 122. State element S9 is supplied with fanin inputs A, B and E. Input A is a primary input, while inputs B and E are state elements that have already been mapped with state elements of the implementation circuit and designated with letter identifiers. State element S9 sends outputs to a state element that has not yet been mapped (shown as a blank box), a mapped state element C, and also to state element S11. In addition to receiving the output of S9 as an input, state element S11 also receives fanin inputs from mapped state element J and primary input D. In turn, state element S11 sends outputs to mapped state element B, primary output F, and another unmapped state element. As can be discerned in FIG. 3a, state elements I45 and I59 of the implementation circuit 122 have the same mapped inputs and outputs as elements S9 and S11, respectively, of the specification circuit 120.

At the beginning of the functional phase, fanin and fanout partial signatures are constructed for each of the state elements of the specification circuit 120 and implementation circuit 122. Table 1 shows the fanin and fanout partial signatures of each of the elements S9, S11, I45 and I59 shown in FIG. 3a.

TABLE 1

| State Element | Fanin partial signature | Fanout partial signature |
|---|---|---|
| S9 | A, B, E | C |
| S11 | D, J | B, F |
| I45 | A, B, E | C |
| I59 | D, J | B, F |

The state elements are then classified according to their fanin and fanout partial signatures. FIG. 4 is an exemplary listing of state elements which share the particular fanin and fanout signatures listed in Table 1. As shown in Stage 1 of FIG. 4, the fanin signature group 204 contains two columns, one of which lists all state elements having fanin partial signature A, B, E ("the A,B,E column") and the other of the two columns lists all state elements having partial fanin signature D, J ("the D,J column"). The A,B,E column contains only two state elements, S9 and I45, one from either circuit, and therefore a mapping between S9 from the specification circuit and I45 from the implementation circuit is indicated. The D, J column contains more than two entries as do the columns in the fanout signature group 206. Therefore, no further mappings are ascertained in Stage 1.

During the mapping of S9 and I45, each of these elements is given an identification that indicates that they are mapped elements. In FIG. 3b, both S9 and I45 are designated "R" in Stage 2. With element R identified, the fanin partial signatures of S11 and I59 are updated because one of their inputs, previously unmapped, is now mapped and can be added to their fanin partial signatures. In the fanin signatures section of Stage 2 in FIG. 4, the column formerly marked as D, J is now marked as the D, J, R column to reflect the newly mapped input R. The addition of the R state element has narrowed the group of elements listed in the column down to two elements S11 and I59. These elements can now be mapped to one another. From the exemplary illustration of Stage 1 and Stage 2, it can be seen that mappings from previous stages provide information from which further mappings are determined in subsequent stages. This is an iterative process which continues until a fix point is reached, when no further mappings can be ascertained from fanin and fanout partial signatures. The fix point can be configured to halt the structural phase after a certain number of iterations in which no further mappings are produced.

Figure 5:
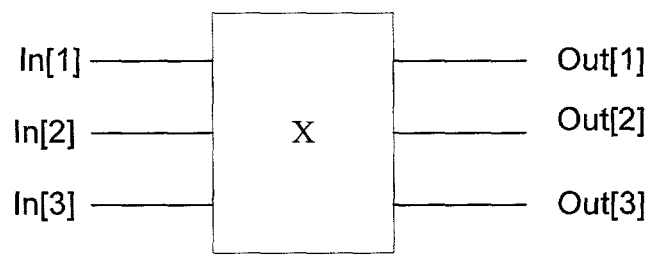
FIG. 5 illustrates exemplary state elements and corresponding truth tables for the two elements indicating don't care conditions according to an embodiment of the present invention.
Figure 5:
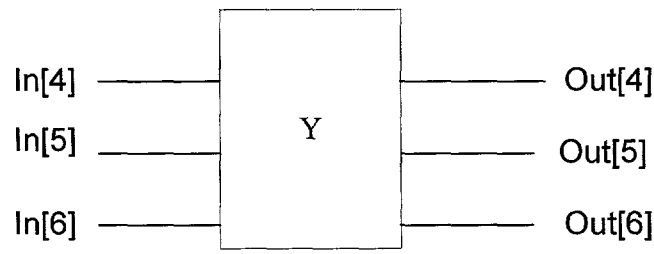

After the fix point is reached, the inversion phase, Phase 1.5, is used to detect inverse mappings and to validate the mappings found in the structural phase, Phase 1. According to an embodiment, the detection process is restricted to originally name-mapped state elements, or to state elements mapped in the previous structural phase. Additionally, prior to inversion detection, certain conditions may be selected out as "don't care" conditions. FIG. 5 illustrates exemplary don't care input conditions for particular mapped state elements X and Y. Each state element X, Y has three inputs and three outputs, truth tables 250, 255 showing the outputs of elements X, Y as a function of inputs are also shown. For example, the input condition 0, 1 ,1 (one bit-value for each of the three inputs) is stipulated as a don't care condition. As shown in FIG. 5 in truth table 250, when inputs In[1], In[2] and In[3] of state element X are given the don't care inputs 0, 1 and 1, respectively, the outputs Out[1], Out[2] and Out[3] have respective values 1, 0 and 1. When the same don't care condition is applied to state element Y on analogous inputs In[4], In[5] and In[6], the outputs Out[4], Out[5] and Out[6] of state element Y, analogous to outputs Out[1], Out[2] and Out[3], respectively, of state element X, yield different values 0, 1 and 1. However, even though the state elements X and Y yield different outputs for a particular input condition, they remain mapped to each other because the condition was stipulated as a don't care condition.

After identification of don't care conditions, the mappings determined in the structural phase are tested during the inversion phase using combinational simulation. During combinational simulation, each of the primary inputs and the state element outputs which feed input to the state elements in a mapping are simulated using random input vectors, and the respective output of the two mapped state elements is compared. In the random input vectors, 1s, 0s and Xs are put onto the primary inputs and state element outputs which feed the mapped state elements. Primary inputs and the input from state elements which have been previously mapped and have a known polarity (i.e. it is already known whether they are direct or inverse mapped) are given bit values of one or zero, while inputs from unmapped state elements or mapped state elements of unknown polarity are given a value X. Additionally, inverse mapped inputs are given opposite values between the two mappings in accordance with their opposite functionality. In one implementation of the 3-valued simulation, a 32-bit-panel simulation is used in which a 32-bit "word" is entered into each mapped state element input. In this manner, 32 simulations are performed in parallel, with each bit of the 32-bit word producing an individual simulated output.

Figure 6:
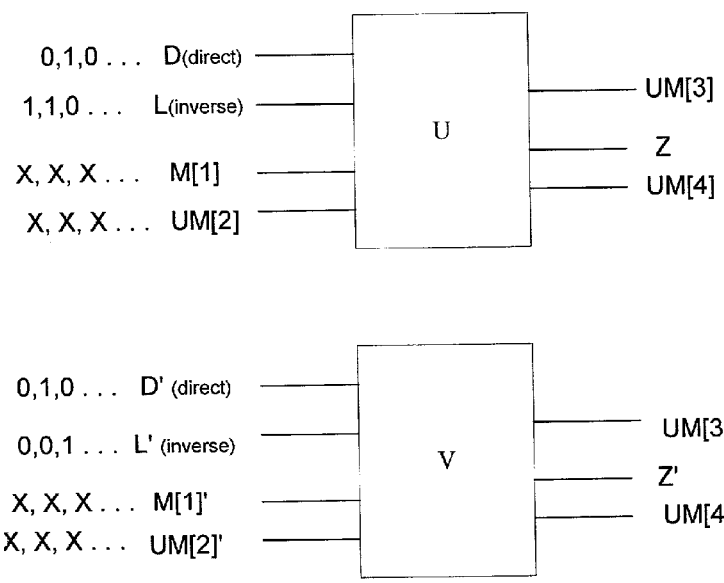
FIG. 6 shows two exemplary state elements and a truth table for the elements, illustrating an embodiment of the inversion detection phase according to the present invention.

In FIG. 6, an exemplary inversion detection simulation is illustrated using mapped state elements U in the specification circuit 120 and V in the implementation circuit 122. In this exemplary illustration, both elements U and V have respective direct mapped inputs D and D', respective inverse mapped inputs L, L', respective mapped inputs M[1], M[1]' for which the polarity is undetermined, and unmapped inputs UM[2], UM[2]'. State elements U and V also have respective mapped outputs Z, Z' and two unmapped outputs UM[3], UM[4] and UM[3]', UM[4]'.

The truth table 270 in FIG. 6 indicates the output values at Z, Z' for various combinations of input values at respective inputs D, D', L, L'. Each column has 32 rows (of which only several are shown), one for each bit of a 32-bit word. It is noted that D and D' have the same inputs in any given simulation, while L and L' have opposite inputs in any given simulation as they are inverse mapped. As shown, for each of the inputs, Z and Z' have exactly opposite-valued outputs, with one exception. In the row numbered 32, the set of inputs at D (=1), D' (=1), L (=0) and L' (=1) produce X values at the outputs Z, Z'. This result is a consequence of the undetermined elements, M[1], M[1]', UM[1], UM[1]' which affect the outputs Z, Z'. Due to the presence of the undetermined state elements (mapped and unmapped) the values at mapped outputs, such as Z, Z' can be indeterminate. However, having Xs at the output of Z, Z' does not invalidate the mapping, which, from the evidence that state elements U, V output opposite values at Z, Z' for each equivalent set of inputs, is determined to be an inverse mapping. If instead of having Xs for outputs for Z, Z' in row 32, the outputs at Z and Z' were both 1, the mapping would be invalidated because the consistent pattern of opposite valued outputs at Z, Z', indicating an inverse mapping relationship would be broken, demonstrating inconsistent functionality between state elements U and V.

The inversion detection phase is also iterative, Mappings found in a stage are used to improve the input vectors fed in during subsequent stages to update the inputs and outputs of the various state element mappings. The completion of this stage occurs in two instances: when the polarity of all known mappings has been determined, or, after a configurable number of iterations in which no further determinations are made.

Figure 7:
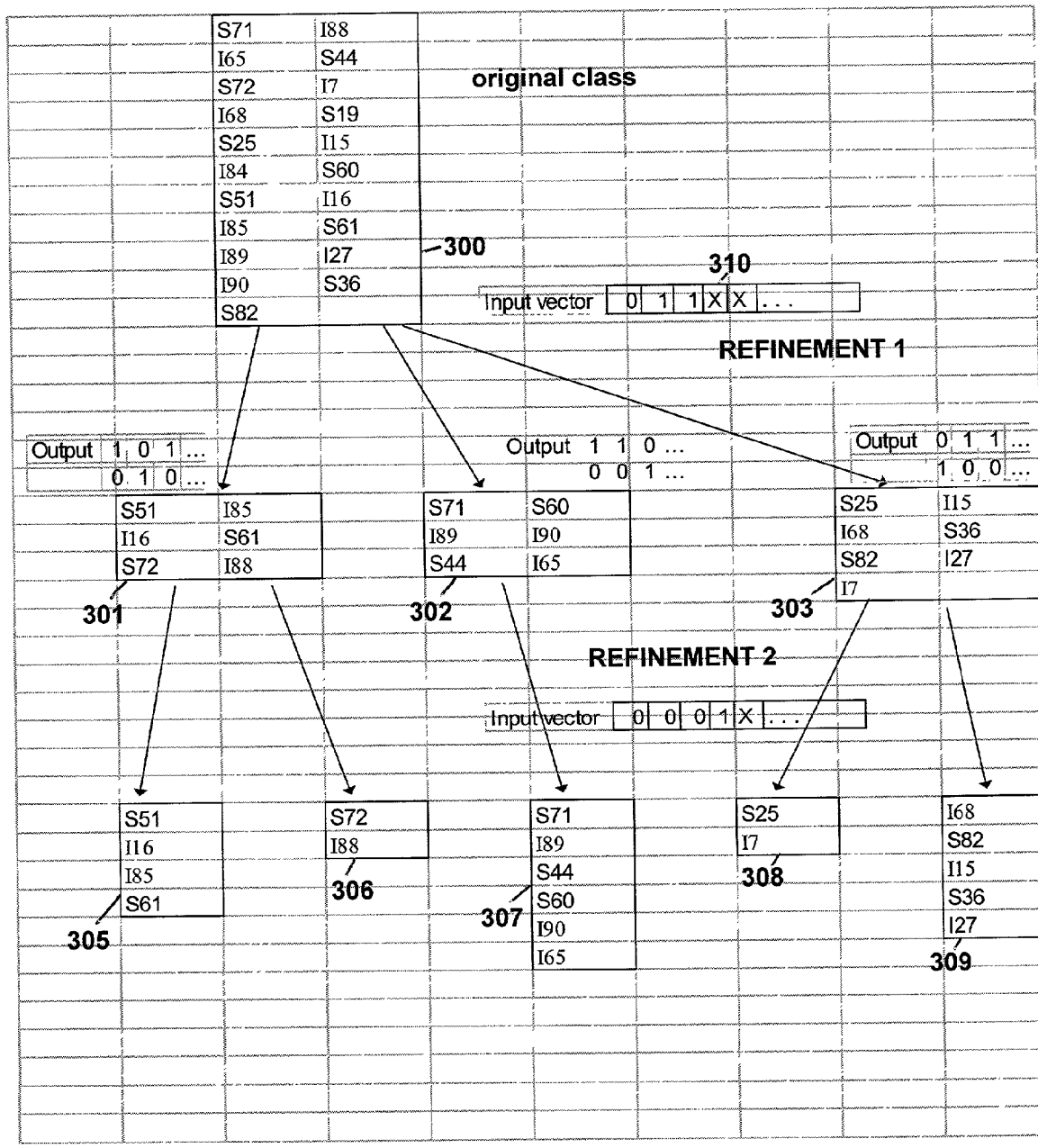
FIG. 7 illustrates exemplary equivalence classes and refinement stages according to an embodiment of the functional phase of the present invention.

Once the inversion detection phase is complete, the functional phase, Phase 2, commences. As an initial step, all unmapped state elements are placed into a single class. For purposes of illustration, FIG. 7, a simplified schematic diagram, shows a list of candidate unmapped state elements 300. Each of the unmapped elements listed is supplied via corresponding mapped and unmapped inputs. In a series of refinement simulations, each of the unmapped elements is provided with equivalent bit values at each mapped input and X/s on their unmapped inputs in a 3-valued simulation. For example, during a first refinement simulation, all inputs to state elements from mapped state element A are supplied a zero and all inputs from element C are supplied a one. Each of the various inputs can be combined and represented as an input vector 310. The unmapped state elements respond to the input vector by outputting a corresponding output vector. Those unmapped elements having output vectors with similar features (or exactly complementary features) are grouped into equivalence classes. In FIG. 7, the first refinement uses an input vector 0, 1,1, X, X . . ., which breaks up the original class into 3 equivalence classes 301, 302 and 303.

In the illustrative example shown in FIG. 7, equivalence class 301 contains elements whose output vectors have the partial initial pattern 101 (followed by any other pattern), or the complementary pattern 010, output from particular mapped elements. Similarly, the elements of class 302 output vectors having the partial initial pattern 110 or 001. Lastly, the uniting property of equivalence class 303 is the output vector pattern 011 or 100. Each equivalence class 301, 302 and 303 contains six or seven state elements, so that no mappings can be deduced directly from the classes. During a second refinement, each the elements are supplied with a different input vector 0,0,0,1,X . . . , which further refines class 301 into sub-equivalence classes 305, 306, class 302 into sub-equivalence class 307, and class 303 into sub-classes 308 and 309. Two of the sub-classes contain two elements, one from the specification circuit, and one from the implementation circuit, so that these groups of two elements can be mapped to one another based on functional equivalence as ascertained during the second level of refinement. The functional phase is also iterative, and input vectors are improved using the mappings corresponding to sub-classes 306 and 308 and used in subsequent refinement stages.

Classes 305, 307 and 309 may be further refined during subsequent simulations. However, it is possible that after a number of simulations, that these equivalence classes may not be refined to the point that mappings can be drawn. The completion of the functional phase may therefore not result in a complete mapping of each of the elements of the implementation circuit to a single element of the specification circuit. As with previous phases, the functional phase may be configured to end either when a mapping is complete or after a set number of iterations in which no changes occur.

Figure 8:
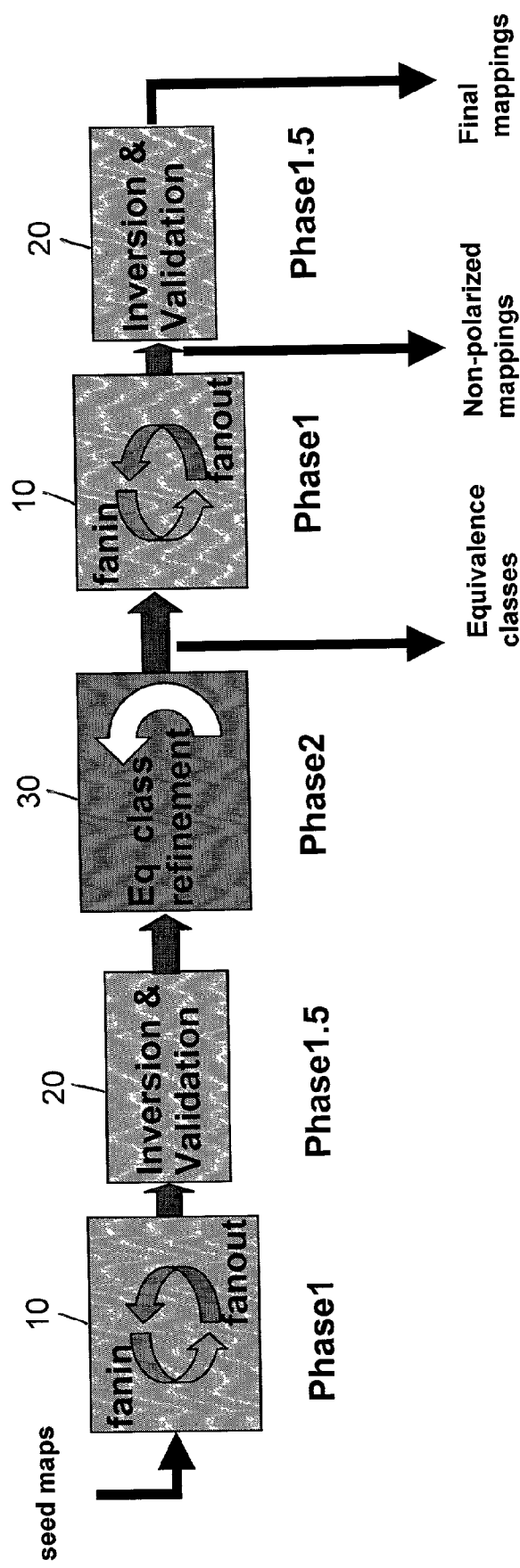
FIG. 8 shows a functional block diagram of an embodiment of the automatic state element mapping method according to the present invention.

If after the functional phase has ended, the state element mapping is not complete, the refinements made during the functional phase can be used during further processing. In an embodiment of the state element mapping technique of the present invention, the original three phases: the structural phase (1), the inversion detection phase (1.5), and the functional phase (2) are followed by a second structural phase and a second inversion detection phase. A functional block diagram of this embodiment is shown in FIG. 8. As can be discerned, seed maps are provided, and then the first round of structural 10, inversion-detection 20 and functional phases 30 are performed. After the end of the functional phase, sets of equivalence classes are output. After the following second structural phase 10, a set of non-polarized mappings is output and after the second inversion detection phase 20, a final set of mappings is produced. Depending upon different needs and circumstances, the output equivalence classes or non-polarized mappings may be the intended output. For example, there may be instances in which equivalences classes can provide useful information about the function of state elements apart from and in addition to the mappings deduced from the classes.

In the foregoing description, the method of the present invention has been described with reference to a number of examples that are not to be considered limiting. Rather, it is to be understood and expected that variations in the principles of the method and apparatus herein disclosed may be made by one skilled in the art and it is intended that such modifications, changes, and/or substitutions are to be included within the scope of the present invention as set forth in the appended claims. For example, the random simulations described above can be performed using various parallel or sequential techniques depending on computing parameters. Furthermore, while the mechanisms described can be embodied in hardware within a computer processor, the invention is not necessarily limited thereby, and the programmed logic that implements the mechanisms can be separately embodied and stored on a storage medium, such as read-only-memory (ROM) readable by a general or special purpose programmable computer, for configuring the computer when the storage medium is read by the computer to perform the functions described above.

What is claimed is:

1. A method for automatically mapping state elements between a first circuit and a second circuit, comprising:
    a) comparing, in a structural phase, structural features of state elements in the first circuit to structural features of state elements in the second circuit for equivalence;
    b) determining, during the structural phase, mappings between state elements of the first circuit and the second circuit based on the comparison of the structural features;
    c) accounting for don't care input conditions before comparing state element function;
    d) detecting, in an inversion detection phase, the polarity of the mappings;
    e) comparing, in a functional phase, the functionality of state elements in the first circuit to state elements in the second circuit for equivalence using a three-valued simulation;
    f) determining further mappings based upon the functional comparison during the functional phase; and
    g) detecting whether a threshold condition for completion of the mapping process is satisfied.

2. The method of claim 1, further comprising:
h) building, in the structural phase, initial fanin and fanout partial signatures for each state element in the first and second circuits;
i) determining whether at least one of a fanin partial signature and a fanout partial signature for a first unmapped state element in the first circuit is equivalent to a respective one of a fanin partial signature and a fanout partial signature of a second unmapped state element of the second circuit;
j) further determining if the first state element and the second state element are the only state elements which share an equivalent at least one of a fanin partial signature and fanout partial signature; and
k) mapping the first and second state elements to one another if it is determined that they are the only state elements which share the at least one of the fanin partial signature and fanout partial signature.

3. The method of claim 2, further comprising:
l) updating the fanin and fanout partial signatures of the state elements of the first and second circuits based on the mapping between the first and second state elements.

4. The method of claim 3, further comprising:
repeating steps i) through l) until a fix point is reached ending the structural phase, the fix point occurring at a completion of a number of repeated iterations during which no further mappings are determined.

5. The method of claim 2, wherein the fanin partial signature is a list of mapped inputs to the state element, and the fanout partial signature is an alphabetically sorted list of mapped outputs from the state element.

6. The method of claim 1, further comprising:
m) inputting random values, excluding don't care conditions, to each element of a pair of mapped state elements during the inversion detection phase, the random values being bit values for mapped inputs having a known polarity and being a third value for unmapped inputs and mapped inputs having an unknown polarity;
n) comparing output values from each element of the pair of state elements based on the input random values; and
o) determining whether the pair is one of direct and inverse mapped based on the comparison.

7. The method of claim 6, wherein the mapped inputs to each element of the pair of elements having a known polarity are one of direct mapped inputs and inverse mapped inputs, direct mapped inputs to each element being provided with equivalent random values, inverse mapped inputs to each element being provided with complementary random values.

8. The method of claim 7, further comprising:
p) updating the fanin and fanout partial signatures of the state elements of the first and second circuits to reflect the determination of polarity for the pair of state elements.

9. The method of claim 6, further comprising:
q) validating the mapping of the pair of state elements if the comparison indicates that the mapping is one of a direct mapping and an inverse mapping.

10. The method of claim 6, further comprising:
simulating parallel versions of a pair of mapped state elements;
making parallel comparisons of the parallel versions; and
determining whether the pair is one of direct and inverse mapped based on the comparisons of the parallel versions.

11. The method of claim 10, wherein 32 parallel version are simulated using 32-bit panel simulation.

12. The method of claim 8, further comprising:
repeating steps m) through q) until an inversion fix point is reached ending the inversion detection phase, the inversion fix point occurring after completion of a number of repeated iterations during which no further polarity determinations are made.

13. The method of claim 12, further comprising:
r) grouping, in the functional phase, all unmapped state elements in an initial class;
s) inputting equivalent random values to each of the unmapped state elements; and
t) refining the unmapped state elements into equivalence classes based upon at least one of an equivalent output property and a precisely opposite output property generated in response to the input random values.

14. The method of claim 12, wherein random bit values are input to mapped inputs and a third value is input to unmapped inputs.

15. The method of claim 13, further comprising:
u) determining equivalence classes which include two state elements, one state element being from each of the first and second circuits;
v) mapping the two state elements in the determined equivalence classes to one another; and
w) updating the fanin and fanout partial signatures of the state elements of the first and second circuits based on the mapping between the two state elements.

16. The method of claim 15, further comprising:
repeating steps s) through w) until a functional fix point is reached, the functional fix point occurring after a completion of one of:
I) a number of repeated iterations during which no further mappings are determined; and
II) a mapping of all state elements of the first and second circuits; and
outputting mappings and equivalence classes.

17. The method of claim 1, further comprising:
comparing, in a second structural phase, structural features of state elements in the first circuit to structural features of state elements in the second circuit for equivalence;
determining, during the second structural phase, mappings between state elements of the first circuit and the second circuit based on the comparison of the structural features;
detecting, in a second inversion detection phase, the polarity of the mappings; and
outputting final mappings as a function of the detection;
wherein, in each phase, results from all previous phases are used to improve inputs.

18. An article comprising a computer-readable medium which stores computer-executable instructions for causing a computer system to:
compare, in a structural phase, structural features of state elements in the first circuit to structural features of state elements in the second circuit for equivalence;
determine, during the structural phase, mappings between state elements of the first circuit and the second circuit based on the comparison of the structural features;
account for don't care input conditions before comparing state element function;
detect, in an inversion detection phase, the polarity of the mappings;

compare, in a functional phase, the functionality of state elements in the first circuit to state elements in the second circuit for equivalence using a three-valued simulation;

determine further mappings based upon the functional comparison during the functional phase; and detect whether a threshold condition for completion of the mapping process is satisfied.

19. The article of claim 18 which further stores instructions causing a computer system to:

input random values to each element of a pair of mapped state elements during the inversion detection phase, the random values being bit values for mapped inputs having a known polarity and being a third value for unmapped inputs and mapped inputs having an unknown polarity;

compare output values from each element of the pair of state elements based on the input random values; and determine whether the pair is one of direct and inverse mapped based on the comparison.

20. A computer system for automatically mapping state elements between a first circuit and a second circuit, comprising:

an input interface; and a processor, the processor configured to:

compare, in a structural phase, structural features of state elements in the first circuit to structural features of state elements in the second circuit for equivalence;

determine, during the structural phase, mappings between state elements of the first circuit and the second circuit based on the comparison of the structural features;

account for don't care input conditions specified using the input interface before comparing state element function;

detect, in an inversion detection phase, the polarity of the mappings;

compare, in a functional phase, the functionality of state elements in the first circuit to state elements in the second circuit for equivalence using a three-valued simulation;

determine further mappings based upon the functional comparison during the functional phase; and detect whether a threshold condition for completion of the mapping process is satisfied.

21. The computer system of claim 20, wherein the processor is further configured to:

input random values to each element of a pair of mapped state elements during the inversion detection phase, the random values being bit values for mapped inputs having a known polarity and being a third value for unmapped inputs and mapped inputs having an unknown polarity;

compare output values from each element of the pair of state elements based on the input random values; and determine whether the pair is one of direct and inverse mapped based on the comparison.

* * * * *